United States Patent [19]

Dirksen et al.

[11] Patent Number: 5,485,272
[45] Date of Patent: Jan. 16, 1996

[54] RADIATION-SOURCE UNIT FOR GENERATING A BEAM HAVING TWO DIRECTIONS OF POLARISATION AND TWO FREQUENCIES

[75] Inventors: Peter Dirksen; Manfred G. Tenner; Jan E. van der Werf, all of Eindhoven, Netherlands

[73] Assignee: U.S. Philips Corporation, New York, N.Y.

[21] Appl. No.: 247,933

[22] Filed: May 24, 1994

[30] Foreign Application Priority Data

Dec. 17, 1993 [BE] Belgium ............................ 09301407

[51] Int. Cl.$^6$ ........................................ G01B 9/02
[52] U.S. Cl. ................ 356/349; 356/351; 356/358
[58] Field of Search ........................... 356/345, 349, 356/351, 358, 363

[56] References Cited

U.S. PATENT DOCUMENTS

| | | |
|---|---|---|
| 3,825,348 | 7/1974 | Nomarski et al. ............... 356/349 |
| 4,295,741 | 10/1981 | Palma et al. .................... 356/349 |
| 4,627,731 | 12/1986 | Waters et al. .................. 356/349 |
| 4,904,068 | 2/1990 | Tatsuno et al. . |
| 5,002,395 | 3/1991 | Shah ............................ 356/349 |
| 5,100,237 | 3/1992 | Wittekoek et al. . |
| 5,191,465 | 3/1993 | Yamashita et al. . |

FOREIGN PATENT DOCUMENTS

| | | |
|---|---|---|
| 0194941 | 9/1986 | European Pat. Off. . |
| 1384949 | 3/1988 | U.S.S.R. ................... 356/351 |

OTHER PUBLICATIONS

"Displacement Measurement with a Laser Interferometer" De Lang et al, Philips Technical Review, vol. 30 (1969) pp. 160–166.

"Zweifrequenz–Laserwegmebsystem Fur Extreme Verfahgeschwindigkeiten Und Hohe Genauigkeit" Muller et al, Technisches Messen 58 (1991) pp. 253–257.

Primary Examiner—Samuel A. Turner
Attorney, Agent, or Firm—Michael J. Balconi-Lamica

[57] ABSTRACT

A radiation-source unit is described which produces a radiation beam (30) with two components (9, 10) which are polarized perpendicularly relative to one another and which have different frequencies. The unit comprises a radiation source, a beam splitter (4), an acousto-optical modulation system (13, 18) for generating the frequency difference, and a beam combiner (25). Since the beam splitter and the beam combiner are transmission elements and their connecting line extends through the center of the modulation system the unit is compact and no alignment problems occur. Moreover, the frequency difference is adjustable over a wide range.

20 Claims, 7 Drawing Sheets

RADIATION-SOURCE UNIT FOR GENERATING A BEAM HAVING TWO DIRECTIONS OF POLARISATION AND TWO FREQUENCIES

BACKGROUND OF THE INVENTION

1. Field of the Invention

The invention relates to a radiation-source unit for producing a radiation beam having two components which are polarised perpendicularly to one another and which have different frequencies, which unit comprises a coherent radiation source, a beam splitter, an acousto-optical modulation system for generating a frequency difference between two sub-beams formed by the beam splitter, and a beam combiner for recombining the two sub-beams emerging from the modulation system to one beam.

The invention also relates to an interferometer and to a device for detecting the position of two objects relative to one another, both provided with such a radiation-source unit. The invention further relates to an apparatus for projecting a mask onto a substrate, comprising such an interferometer and/or such a position-detection device.

2. Discussion of the Related Art

The article "Displacement measurement with a laser interferometer" in "Philips' Technical Review", Vol. 30 (1969), pp. 160–166, describes an interferometric displacement measuring device whose radiation-source unit is a so-called Zeeman laser. Such a laser comprises, for example, a single-mode He-Ne laser, across which a magnetic field is applied in the longitudinal direction. As a result, the laser generates two opposite circularly polarised modes having different optical frequencies instead of a single linearly polarised mode.

However, a Zeeman laser can deliver only a limited power, which is particularly disadvantageous in more recent applications in which the laser beam is to be split into more than two beams. Moreover, a Zeeman laser is comparatively expensive and very sensitive to optical feedback, which means that radiation reflected into the laser from the optical measuring system may cause variations in amplitude and frequency of the emitted laser beam, which may affect the measurement result. In addition, the frequency difference between the two mutually perpendicularly polarised components is at the most 2 MHz, so that the Zeeman laser is suitable only for measuring limited distances or limited speeds.

U.S. Pat. No. 5,191,465 describes a radiation-source unit specially intended for aligning a mask relative to a substrate in an opto-lithographic apparatus for imaging the mask on the substrate. This radiation-source unit comprises a laser, a neutral beam splitter, a separate acousto-optical modulator in each of the paths of the sub-beams formed by the beam splitter, and a polarisation-sensitive beam combiner. The drive signals for the two modulators have different frequencies, so that different frequencies are impressed upon the sub-beams. A λ/2 plate has been arranged in the path of one of the sub-beams, as result of which the two sub-beams have mutually perpendicular directions of polarisation. As both the beam splitter and the beam combiner are semitransparent reflectors and two further reflectors have been provided the radiation-source unit in accordance with U.S. Pat. No. 5,191,465 is highly susceptible to alignment errors and its stability is unsatisfactory.

SUMMARY OF THE INVENTION

It is an object of the present invention to provide a radiation-source unit of the type defined in the opening paragraph, which does not have the disadvantages of the known units, delivers a comparatively high power, is immune to positional deviations of the components, and has the possibility of adjusting the frequency difference over a wide range.

The radiation-source unit in accordance with the invention is characterised in that the beam splitter is a polarisation-sensitive beam splitter which forms two linearly polarised sub-beams having mutually perpendicular directions of polarisation, in that the beam splitter and the beam combiner operate in transmission, and in that their connecting line extends through the centre of the modulation system.

This radiation-source unit is of a symmetrical design and can be of a compact construction. Moreover, the source radiation is utilised to an optimum extent and the radiation efficiency of the unit is dictated primarily by the transmission efficiency of the modulator. Since no reflecting elements are used for splitting the radiation beam and combining the sub-beams no stringent requirements have to be imposed on the alignment of the components. The connecting line is to be understood to mean the line connecting the centres of those beam splitter and beam combiner parts where beam splitting and beam combination is effected, respectively. The radiation source may be coherent or only partly coherent. The required degree of coherence depends upon the use of the radiation-source unit.

A first embodiment of the radiation-source unit in accordance with the invention is characterised in that the acousto-optical modulation system comprises a separate acousto-optical modulator for each sub-beam, and in that the drive signal for the one modulator has another frequency than the drive signal for the other modulator.

The difference between the frequencies of the components of beam emerging from the unit is determined by the frequency difference of the drive signals. This provides a high degree of freedom in the choice of both the magnitude of and the position in the frequency range of this frequency difference.

A preferred embodiment of the radiation-source unit in accordance with the invention is characterised in that the modulation system comprises one acousto-optical modulator, and in that the chief rays of the sub-beams traverse said modulator along separate paths.

Advantages of this embodiment are that the number of parts is very small and that it is very compact, particularly if the radiation source is a diode laser. The difference between the frequencies of the beam components emerging from the unit is now equal to twice the frequency of the drive signal for the optical modulator, i.e. the acoustic signal.

An embodiment of the radiation-source unit which is particularly suitable for producing a beam whose mutually perpendicularly polarised components exhibit a smaller frequency difference, is characterised in that a second acousto-optical modulator is disposed between said acousto-optical modulator and the beam combiner, and in that the drive signal for the second acousto-optical modulator has another frequency than the drive signal for the first-mentioned acousto-optical modulator.

The second modulator partly compensates for the frequency difference introduced by the first modulator and the frequency difference of the emergent beam components is equal to twice the frequency difference of the drive signals for the modulators. The smaller frequency difference thus obtained enables the field of use of the radiation-source unit to be extended to, for example, alignment systems in opto-lithographic apparatuses.

The radiation-source unit in accordance with the invention may also be combined with elements of prior-art radiation-source units. A first embodiment of a radiation-source unit where this is the case is characterised in that in that the radiation source is a Zeeman laser. In known interferometer systems, such as the system described in the above-mentioned article in "Philips' Technical Review", Vol. 30 (1969), pp. 160–166, the Zeeman laser itself forms a radiation-source unit in the meaning of this term as used in the present Patent Application. The frequency difference of the components of the Zeeman laser beam is comparatively small, for example of the order of 300 kHz to 1.5 MHz, which is too low for certain measuring systems because this frequency difference results in an inadequate time resolution and an inadequate measurement speed for the relevant system. The frequency difference can be increased by combining the Zeeman laser with the beam splitter, the acousto-optical modulation system and the beam combiner of the radiation-source unit.

A second embodiment of the radiation-source unit in accordance with the invention combined with an element of a known radiation source is characterised in that the radiation source is a wavelength-stabilised laser which emits two linearly polarised beams having mutually perpendicular directions of polarisation and having different frequencies.

Such a two-mode laser is used, for example, in the measurement system described in "Technisches Messen" 58, 1991, p. 253. However, besides the advantage of the high wavelength stability this laser has the disadvantage that the frequency difference between the two modes is approximately 640 MHz, so that the electronic circuitry for processing the detector signals is difficult to realise and is expensive, and improving the resolution of the measurement system comprising the laser via interpolation techniques is difficult and expensive. As described in European Patent Specification 0,194,941 this drawback can be mitigated by arranging in the path of the two-mode laser beam, in the following order: a polariser, which transmits only one of the modes; an acousto-optical modulator, which splits a single-mode beam into two sub-beams which are diffracted in different directions and which have a frequency difference of, for example, 20 MHz; a wedge of a birefringent material which converges the two sub-beams; and a diaphragm which transmits these two sub-beams and which blocks two other sub-beams formed by the wedge. However, in the radiation-source unit in accordance with European Patent Specification 0,194,941 the diaphragm transmits only one quarter of the radiation energy delivered by the laser. In accordance with the present invention, the frequency difference can be reduced considerably by arranging, in the following order, a beam splitter, an acousto-optical modulator and a beam combiner in the path of the stabilised laser beam whose modes have a frequency difference of 640 MHz. If the drive signal of the acousto-optical modulator is, for example, 310 MHz the frequency difference of the laser beam components will be reduced by 620 MHz and the frequency difference of the emergent beam components will be 20 MHz. By an appropriate choice of the frequency of the modulator signal this frequency difference can be set to an arbitrary value, thereby extending the range of applications of the radiation-source unit.

The beam splitter and the beam combiner can be constructed in various manners, as is defined in the claims 7 through 11. Generally, the splitter and the combiner are of a similar type, so that a symmetrical unit is obtained whose parts have a wide position and orientation tolerance.

A very compact and stable embodiment of the unit is characterised in that the beam splitter, the acousto-optical modulator and the beam combiner have been integrated in a symmetrical three-element Wollaston prism whose outer elements form the beam splitter and the beam combiner, respectively, and whose inner element has been provided with an electro-acoustic transducer and thus forms the acousto-optical modulator.

This embodiment makes very advantageous use of the fact that the material of which the acousto-optical modulator is made, for example $T_eO_2$ is a uniaxial birefringent crystal, so that this material can also be used for making a Wollaston prism. When this material is used for making a three-element prism whose outer elements have the same shape and the same orientation of the acoustic axis and whose inner element has an optic axis oriented perpendicularly to those of the outer pans and is provided with an electro-acoustic transducer, a device is obtained which can be completed to form a radiation-source unit by merely adding a radiation source. The radiation source is then preferably a diode laser.

The choice of the radiation source is determined inter alia by the desired coherence length of the radiation beam. Since said device, which may also be referred to as an acoustic Wollaston prism, is composed of prism elements it can also perform the function of a beam shaper. The use of such a beam shaper may be desirable when the radiation source is a diode laser. This diode laser produces a beam whose far-field cross-section is elliptical. The beam shaper is used to shape the beam of elliptical cross-section into a beam of circular cross-section as required in the system using the diode laser. The use of a prism system as a beam shaper is known from, inter alia, U.S. Pat. No. 4,904,068.

The last-mentioned embodiment of the radiation-source unit also has a variant which is very suitable for supplying two beam components having a comparatively small frequency difference. This variant is characterised in that the symmetrical three-element Wollaston prism is followed by a similar second symmetrical three-element Wollaston prism and in that the frequency of the drive signal for the acousto-optical modulator of the first three-element Wollaston prism differs from the frequency of the drive signal for the modulator of the second three-element Wollaston prism.

The difference between the frequencies of the emergent beam components is now again dictated by the frequency difference of the drive signals for the modulators of the first and the second three-element Wollaston prism.

A further integrated version of this variant is characterised in that the inner element of the Wollaston prism has been provided with a second electro-acoustic transducer and in that, in operation, drive signals of different frequencies are applied to the two transducers.

The invention also relates to an interferometer comprising a radiation-source unit, a beam splitter for splitting the beam emitted by the radiation-source unit into a measurement beam and a reference beam, a measurement branch traversed by the measurement beam, a reference branch traversed by the reference beam, and a radiation-sensitive detector in the path of the beam formed by recombining the measurement beam and the reference beam which have traversed their respective branches. This interferometer is characterised in that the radiation-source unit is a unit as described above.

The invention further relates to a device for detecting the position of a first object relative to a second object, which objects have been provided with marks, which device comprises an illumination system for producing two beams whose components with the same direction of polarisation together form an interference pattern on both the mark of the first object and the mark of the second object, a first and a second radiation-sensitive detector for convening radiation received from the mark of the first object and the mark of the second object, respectively, into a first electric signal and a second electric signal, respectively, the phase difference between the two signals being indicative of the position of the two objects relative to one another. This device is characterised in that the illumination system includes a radiation-source unit as described above.

Finally, the invention relates to an apparatus for projecting a mask onto a substrate, which apparatus comprises, in succession, an illumination system producing an actinic radiation beam, a mask holder, a projection lens system, and a substrate holder, and further comprises an alignment system for aligning the mask relative to the substrate. This apparatus is characterised in that the alignment system includes the position detection device described above, the first object being the mask and the second object being the substrate.

An actinic radiation beam is a beam which induces a chemical change in a photoresist deposited on the substrate.

The photolithographic projection apparatus may also comprise an interferometer system for detecting the position and displacements of the substrate holder. Such an apparatus in accordance with the invention is characterised in that the interferometer system includes a radiation-source unit as described above.

In addition, the apparatus may be provided with the alignment system in accordance with the invention.

BRIEF DESCRIPTION OF THE DRAWINGS

The invention will now be described in more detail with reference to the drawings. In the drawings.

DETAILED DESCRIPTION OF THE PREFERRED EMBODIMENT

Figure 1:
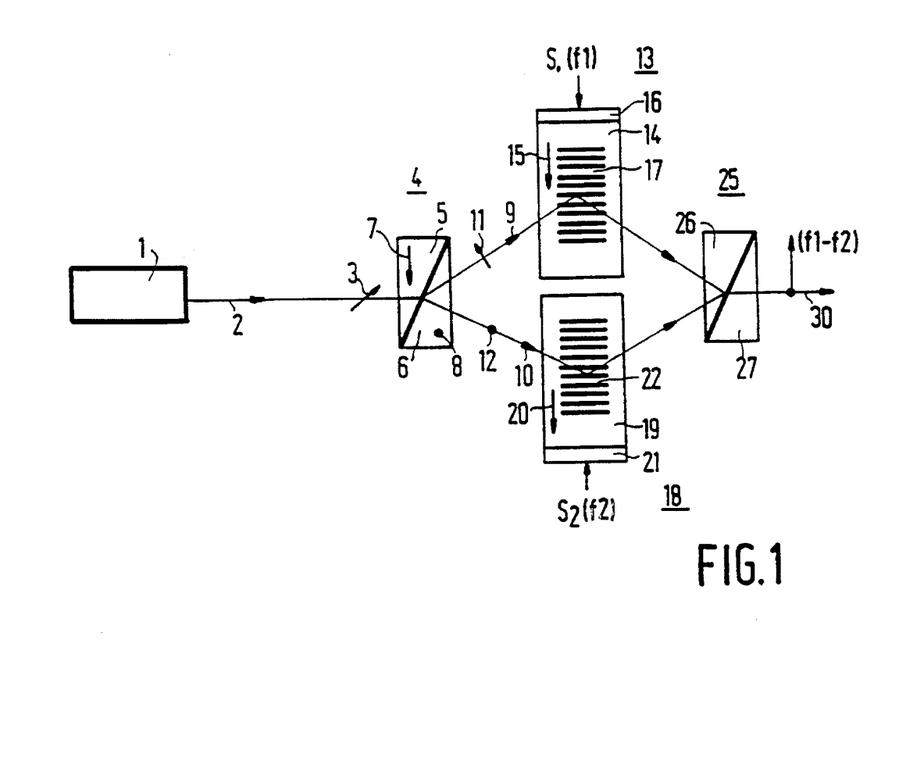
FIG. 1 shows an embodiment of the radiation-source unit with a separate acousto-optical modulator in each of the sub-beams.

The radiation-source unit shown in FIG. 1 comprises a radiation source 1 producing a radiation beam 2. Depending on the use of the unit the beam should have a larger or smaller coherence length, for which reason the source 1 is generally a laser, such as a He-Ne laser or a semiconductor diode laser. A beam splitter in the form of a Wollaston prism 4 is disposed in the path of the beam 2. In its customary form this prism comprises two prism elements 5 and 6 of the same birefringent uniaxial material, for example quartz having, for example, an ordinary refractive index $n_o=1.5443$ and an extraordinary refractive index $n_e=1.5534$. The optic axes 7 and 8 of the prism elements extend perpendicularly to one another. The Wollaston prism splits the beam 2, whose direction of polarisation makes an angle of 45° with the optic axes 7 and 8, into two sub-beams 9 and 10, whose directions of polarisation 11 and 12 are perpendicular to one another.

An acousto-optical modulator 13 is disposed in the path of the sub-beam 9. Such a modulator consists of a block 14 of a uniaxial birefringent material, for example $T_eO_2$ having an ordinary refractive index $n_o=2.2585$ and an extraordinary refractive index $n_e=2.4112$, when a He-Ne laser with a wavelength of 633 nm is used. The optic axis of the modulator bears the reference numeral 15. The block 14 has been provided with an electro-acoustic transducer 16 to which an electric drive signal $S_1(f_1)$ is applied. This signal is convened into a sound wave which propagates in the material 14 in the direction of the optic axis 15. The sound wave forms in the material a three-dimensional pattern of areas which alternately have a higher and a lower refractive index, which pattern behaves as a three-dimensional diffraction grating. This grating, which is known as a Bragg grating, in principle diffracts a beam traversing the modulator into a plurality of diffraction orders. In order to concentrate as much as possible radiation in one order, as is required in the present case, for example a first order, Bragg's condition should be met:

$$\sin(\Theta_d) = \frac{\lambda}{2\Lambda} \quad (1)$$

where $\Theta_d$ is the angle which the chief ray of the entrant beam makes with the grating lines of the grating 17, $\lambda$ is the wavelength of the optical radiation, and $\Lambda$ is the wavelength of the acoustic wave. The acoustic wavelength may also be expressed in the acoustic velocity $V_s$ and the acoustic frequency $f_s$:

$$\Lambda = V_s/f_s,$$

so that Bragg's condition can also be written as:

$$\sin(\Theta_d) = \frac{\lambda \cdot f_s}{2V_s} \quad (2)$$

The optical wave is subjected not only to diffraction but also to a Doppler frequency shift as a result of the acoustic wave. When the acoustic wave approaches the optical wave the frequency of the latter is increased by the acoustic frequency so that:

$$f_{diff} = f_{inc} + f_s,$$

where $f_{diff}$ is the frequency of the diffracted optical wave emerging from the modulator and $f_{inc}$ is the frequency of the entrant optical wave. When the acoustic wave recedes from the optical wave the frequency of the optical wave is reduced by the acoustic frequency:

$$f_{diff} = f_{inc} - f_s.$$

The material of the modulators has been selected in such a manner that the modulators can be used over a wide range of wavelengths. For example, $T_eO_2$ modulators can be used in the wavelength range from 400 nm to 1200 nm.

An acousto-optical modulator 18 has been arranged in the path of the sub-beam 10, which modulator is similar to the modulator 4 and consequently comprises a block 19 of a uniaxial birefringent material with an optical axis 20 and an electro-acoustic transducer 21 mounted on this block. The transducer receives a drive signal $S_2(f_2)$, as a result of which a Bragg grating 22 is formed in the block 19. The sub-beam 10 is deflected and is subjected to a frequency shift $f_2$.

After having traversed their modulators the sub-beams 9 and 10 impinge on a second Wollaston prism 25 similar to the prism 4. The prism 25 deflects the sub-beams in such a manner that they are collinear and coincide. The angles of incidence of the sub-beams on the modulators and the modulator drives are such that the optical frequency of one of the beams, for example the beam 9, is increased by $f_1$ and the optical frequency of the other beam, the beam 10, is reduced by $f_2$. The beam 30 emerging from the Wollaston prism then comprises two components having an optical frequency difference $\Delta f = f_1 - f_2$, which components are linearly polarised and have mutually perpendicular directions of polarisation.

The frequency difference $\Delta f$ can be set to widely different values by choosing the frequencies $f_1$ and $f_2$ of the drive signals $S_1$ and $S_2$. Moreover, the acousto-optical modulators can be designed for a large range of wavelengths.

Figure 2:
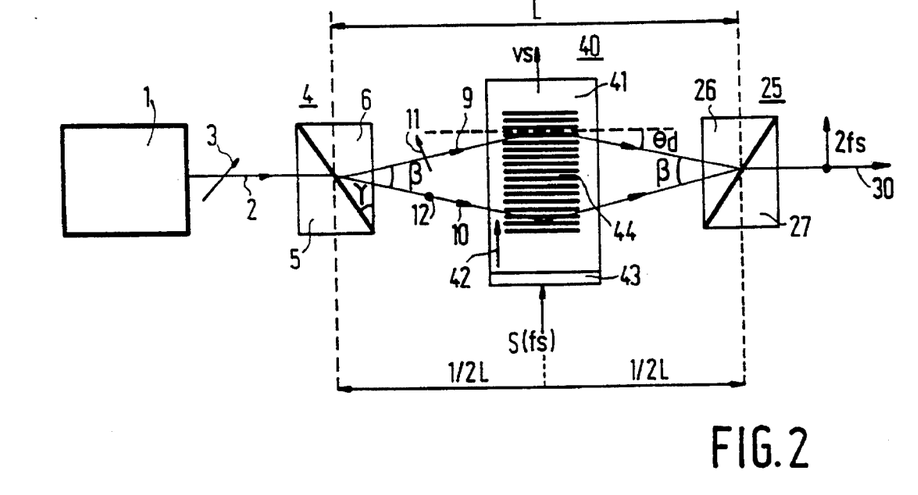
FIG. 2 shows an embodiment of the radiation-source unit with an acousto-optical modulator common to both sub-beams.

FIG. 2 shows a preferred embodiment of the radiation-source unit which makes optimum use of the fact that a Wollaston prism can deflect the sub-beams through comparatively small angles. Since the splitting angle $\beta$ between the sub-beams 9 and 10 emerging from the Wollaston prism is very small these sub-beams can be controlled by the same acousto-optical modulator 40 having an optic axis 42 and provided with an electro-acoustic transducer 43. The modulator 40 deflects the sub-beams 9 and 10 at opposite angles. The optical frequency of one of the beams, for example the beam 9, is increased by the acoustic frequency $f_s$ of the drive signal $S(f_s)$, which produces a Bragg grating 44 in the material 41 of the modulator 40, whilst the optical frequency of the other sub-beam is reduced by $f_s$. The Wollaston prism 25 combines the sub-beams emerging from the modulator 40 to an exit beam 30. The mutually perpendicularly polarised components of this beam exhibit a frequency difference of $2f_2$.

As is shown in FIG. 2 the sub-unit comprising the parts 4, 40 and 25 is symmetrical. The distance between the centre of the prism 4 and the centre of the modulator 40 is equal to half the distance L between the centres of the prisms 4 and 25.

For the radiation-source unit of FIG. 2 the splitting angle 13 is equal to half the Bragg angle $\Theta_d$. As is known, the angle $\beta$ complies with:

$$\sin\beta = 2\Delta n \tan(\gamma),$$

where $\Delta n$ is the difference between the ordinary and the extraordinary refractive index and $\gamma$ is the so-called Wollaston angle. Consequently, the Wollaston angle complies with:

$$\tan\gamma = \frac{\sin\beta}{2\Delta n} \quad (3)$$

and if the following requirement is met:

$$\beta = \frac{1}{2}\Theta_d,$$

where $\beta$ and $\Theta_d$ are small angles, this yields:

$$\tan\gamma = \frac{1}{\Delta n} \cdot \frac{\lambda \cdot f_s}{2V_s} \quad (4)$$

For a Wollaston prism made of quartz and a modulator made of $T_eO_2$, which is driven with an acoustic frequency $f_s \sim 80$ MHz, the Wollaston angle $\gamma$, is approximately 30°. With such an angle a prism comprising only two elements, 5 and 6 or 26 and 27, is adequate. In a first-order approach, the splitting angle $\beta$ between the beams emerging from the Wollaston prism 4 is independent of the orientation or position of the prism 4, so that the radiation-source unit does not require an accurate alignment of its parts and is very stable. The chief rays of the entrant beam 2 and the exit beam 30 coincide with the optical axis of the unit. The efficiency of the unit, i.e. the radiation of the emergent beam 30 expressed as a percentage of the radiation produced by the source, is equal to the efficiency of the modulator 40 and is, for example, 80%.

Figure 3:
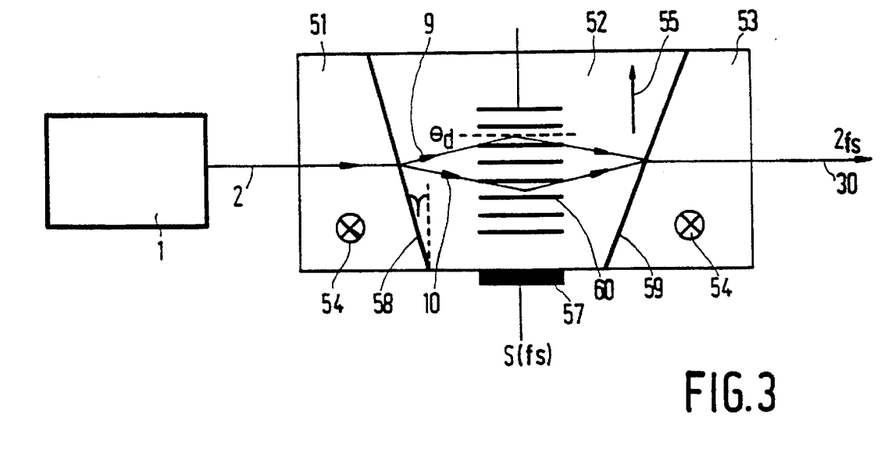
FIG. 3 shows an embodiment of the radiation-source unit in which the beam splitter, the acousto-optical modulator and the beam combiner have been integrated into one device.

FIG. 3 shows a particularly attractive embodiment of the radiation-source unit employing Wollaston prisms as beam splitter and beam combiner. Use is made of the fact that the materials used for an acousto-optical modulator, such as $T_eO_2$, are birefringent so that these materials can also be used for making a Wollaston prism. Moreover, instead of using a two-element Wollaston prism as shown in FIGS. 1 and 2, it is often preferred to use a symmetrical three-element Wollaston prism. Such a prism, which is even more immune to tilting and displacements than a two-element prism, is shown in FIG. 3. It comprises a central prism element 52 and two outer prism elements 51 and 53, all the elements being made of the same birefringent uniaxial material and the outer elements having the same optic axis 54 perpendicular to the optic axis 55 of the central element. Beam splitting and beam combining take place at the interface 58 between the prism elements 51 and 52 and the interface 59 between the prism elements 52 and 53, respectively.

According to the invention an electro-acoustic transducer 57 is arranged on the central element 52, to which transducer a drive signal $S(f_s)$ is applied, which signal generates an acoustic wave in the direction of the optic axis 55 and thereby creates a Bragg grating 60 in the central element 52, causing the sub-beams 9 and 10 to be deflected at opposite angles. As a result of the different directions in which the sub-beams 9 and 10 which emerge from the prism element 51 traverse the central prism element 52, which functions as acousto-optical modulator, the optical frequency of one of the sub-beams is increased by the acoustic frequency $f_s$ and the optical frequency of the other sub-beam is reduced by $f_s$. The frequency difference between the components emerging from the three-element prism 50, hereinafter referred to as acoustic Wollaston prism, is equal to $2f_s$. The Wollaston angle γ again complies with requirement (4). For a modulator made of $T_eO_2$ the angle γ is approximately 2°. The length of the acoustic Wollaston prism is, for example, 1 cm.

Figure 4:
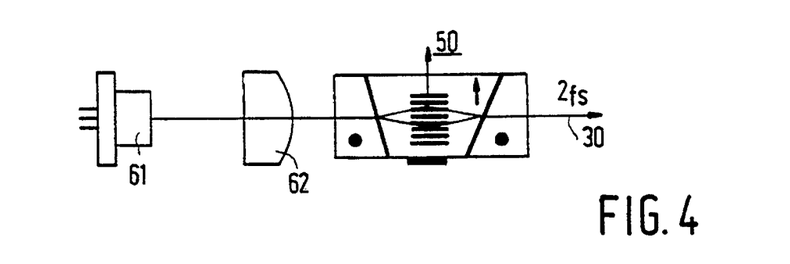
FIG. 4 shows such an embodiment in which the radiation source is a diode laser.

If, as is shown in FIG. 4, the acoustic Wollaston prism 50 is combined with a radiation source in the form of a diode laser 61, a particularly compact radiation-source unit will be obtained. Moreover, a collimator lens 62 may be interposed between the diode laser 61 and the acoustic Wollaston prism 50. The unit shown in FIG. 4 has, for example, an overall length of 5 cm and a diameter of 2.5 cm. The coherence length of the diode laser radiation is for example, 5 cm so that this unit is very suitable for use in, for example, an optical profilometer. A diode laser generates a radiation beam of elliptical cross-section in the far field. For many uses a beam of circular cross-section is required. As is known, a prism system which widens or narrows a beam to different extents in two mutually perpendicular directions can be used to shape a beam of elliptical cross-section into a beam of circular cross-section. The acoustic Wollaston prism 50 in FIGS. 3 and 4 has the additional advantage that it is capable of performing the beam-shaping function.

Figure 5:
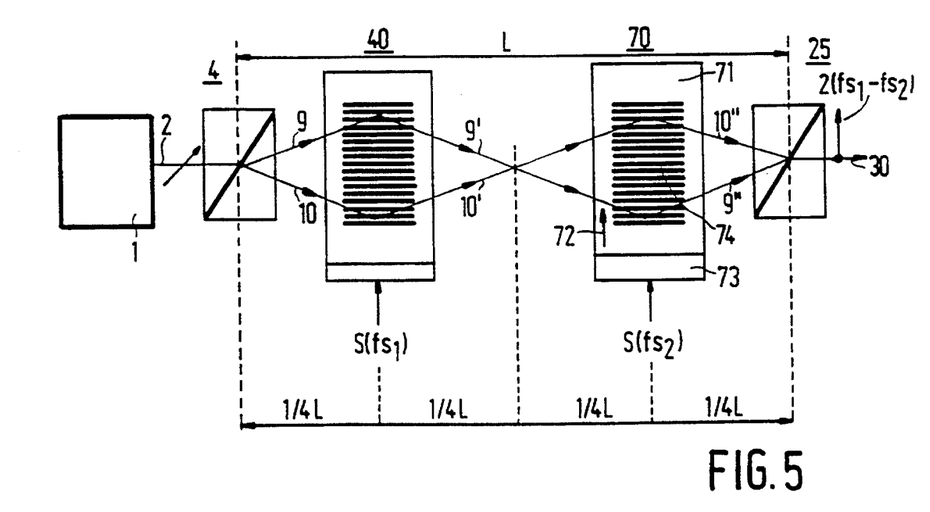
FIGS. 5 and 6 shows two embodiments of the radiation-source unit in which two acousto-optical modulators are arranged in tandem.

FIG. 5 shows an embodiment of the radiation-source unit capable of producing an emergent beam 30 whose mutually perpendicularly polarised components have a frequency difference which is substantially smaller than twice the acoustic frequency. This unit differs from that shown in FIG. 2 in that a second acousto-optical modulator 70 has been arranged at the location of the second Wollaston prism 25 in FIG. 2 and in that the sub-beams 9 and 10 emerging from this modulator are combined by the second Wollaston prism. The modulator 70 is similar to the modulator 40 and the reference numerals 71, 72, 73 and 74 refer to elements of the modulator 70 which correspond to the elements 41, 42, 43 and 44 of the modulator 40. The modulators are driven with the signals $S(f_{s1})$ and $S_{(fs2)}$, the difference between the frequencies $f_{s1}$ and $f_{s2}$ being substantially smaller than each of these frequencies, in such a manner that the second modulator 70 partly compensates for the frequency difference $2f_{s1}$ of the sub-beams 9' and 10' emerging from the modulator 40. The frequency difference Δf of the sub beams 9" and 10" emerging from the modulator 70 is now given by:

$$\Delta f = 2(f_{s1} - f_{s2}).$$

The radiation-source unit shown in FIG. 5 is of a symmetrical construction. The distance L between the centres of the Wollaston prisms 4 and 25 has been divided into four equal parts 1/4L. The Wollaston angle γ again complies with requirement (4). The frequency difference of the emergent beam components can be adjusted to any value between 0 and 10 MHz by an appropriate choice of the frequencies $f_{s1}$ and $f_{s2}$ without any adaptation of the Wollaston prisms 4 and 25. The efficiency of the unit is equal to the product of the efficiencies of the modulators 40 and 70 and is, for example, 60%. L is, for example, 15 cm when standard pans are used.

Figure 6:
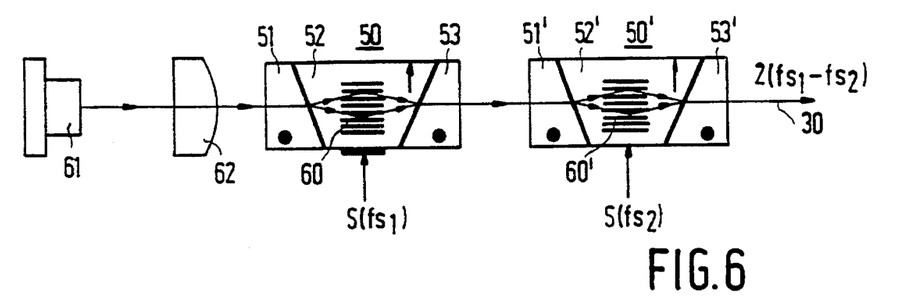

The concept of arranging two modulators driven with different frequencies in tandem in order to obtain an exit beam whose components have a frequency difference which is substantially smaller than each of these drive frequencies can also be realised with acoustic Wollaston prisms. FIG. 6 shows an embodiment where this is the case. This embodiment differs from that shown in FIG. 4 by the use of a second acoustic Wollaston prism 50' having the same construction and operating in the same way as the acoustic Wollaston prism 50'. However, the second prism 50' is driven by a signal $S(f_{s2})$ whose frequency $f_{s2}$ differs from the frequency $f_{s1}$ of the signal $S(f_{s1})$ driving the first prism 50. In the same way as described with reference to FIG. 5 this yields an exit beam 30 whose components have a frequency difference $\Delta f = 2(f_{s1} - f_{s2})$.

Figure 7:
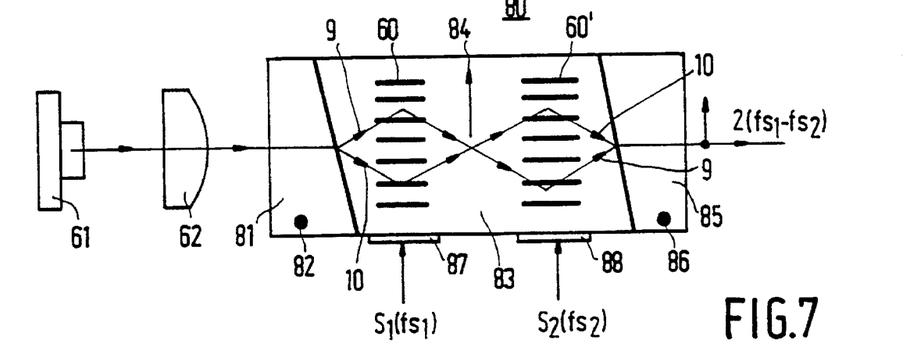
FIG. 7 shows an embodiment of the radiation-source unit in which two modulators in tandem have been integrated into one device.

The radiation-source unit based on the principle illustrated in FIG. 6 can be integrated further, as is shown in FIG. 7. The modulation elements 52 and 52' of the acoustic Wollaston prisms 50 and 50' have now been replaced by a single modulation element 83 and the beam-splitting elements 53 and 53' by a single beam-combining element 85, resulting in one acoustic Wollaston prism 80. Two electro-acoustic transducers 87 and 88 have been arranged on the central element of this prism and receive drive signals $S(f_{s1})$ and $S(f_{s2})$, so that two acoustic waves propagate in the direction of the optic axis 84, thereby forming two Bragg gratings 60, 60', which deflect each of the sub-beams 9 and 10 at opposite angles. The central element 83 is such that the chief rays of the sub-beams 9 and 10, after having traversed the first Bragg grating, intersect one another at a location midway between the gratings 60, 60'. The first Bragg grating 60 introduces a frequency difference $2f_{s1}$ between the sub-beams 9 and 10 and the second Bragg grating 60' partly compensates for this frequency difference, so that the frequency difference between the mutually perpendicularly polarised components of the beam emerging from the acoustic Wollaston prism 80 is equal to $2(f_{s1} - f_{s2})$.

It is known to use a wavelength-stabilised He-Ne laser as a radiation source in interferometer systems in order to obtain a very stable measurement system. Such a laser emits in two modes with mutually perpendicular directions of polarisation, which modes exhibit a frequency difference of, for example, 640 MHz, so that the electronic circuits for processing the detector signals are difficult to realise and expensive and improving the resolution of the measurement system comprising the laser via interpolation techniques is difficult to realise. In order to avoid there problems only one of the modes can be used and the beam can be passed successively through an acousto-optical modulator, a birefringent wedge and a diaphragm, as described in European Patent Specification 0,194,941, in order to obtain a beam having two components whose frequency difference is, for example, 20 MHz. The exit beam then contains only 20% of the original laser energy.

Figure 8:
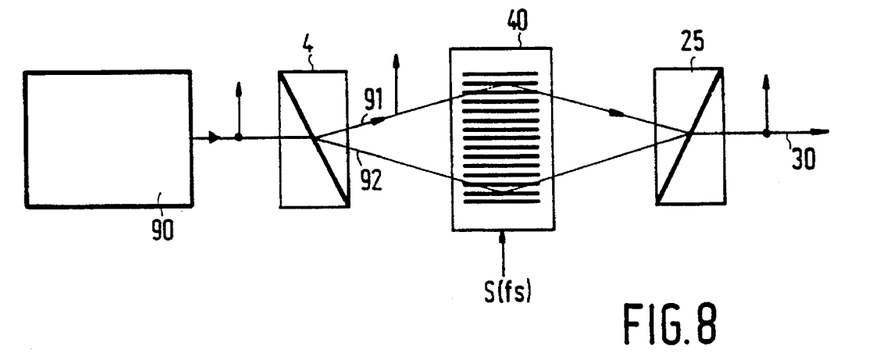
FIG. 8 shows an embodiment of the radiation-source unit whose radiation source is a wavelength-stabilised laser.

In accordance with a further aspect of the present invention the frequency difference of the components of a wavelength-stabilised laser can be reduced considerably without a substantial loss of radiation. FIG. 8 shows an embodiment by means of which this is realised. The wavelength-stabilised laser 90 emits two mutually perpendicularly polarised beam components whore frequency difference is, for example, 640 MHz. The Wollaston prism 4 splits the beam 91 into two sub-beams 92 and 93 having mutually perpendicular directions of polarisation and traversing an acousto-optical modulator 40 in different directions. This modulator is driven by a signal $S(f_s)$ whose frequency $f_s$ is, for example, 310 MHz. As a result of this, the optical frequency of one of the sub-beams is reduced by 310 MHz and that of the other sub-beam is increased by 310 MHz in the present example, so that the frequency difference between the sub-beams which emerge from the modulator and, as consequence, between the beam components of the exit beam 30 is equal to 20 MHz. The frequency difference can be adjusted to arbitrary values by a suitable choice of the acoustic frequency $f_s$, so that the radiation-source unit with a wavelength-stabilised laser can be used more widely.

Likewise, it is possible to extend field of use of the Zeeman laser, which is frequently employed in interferometric arrangements and which supplies two beam components with a comparatively small frequency difference, for example 500 kHz. A radiation-source unit where this is the case can be obtained by replacing the wavelength-stabilised laser 90 in the embodiment shown in FIG. 8 by a Zeeman laser.

The radiation source used in the embodiments shown in FIGS. 1, 2, 3, 4, 5 or 6 can also be a wavelength-stabilised laser or a Zeeman laser.

Figure 9:
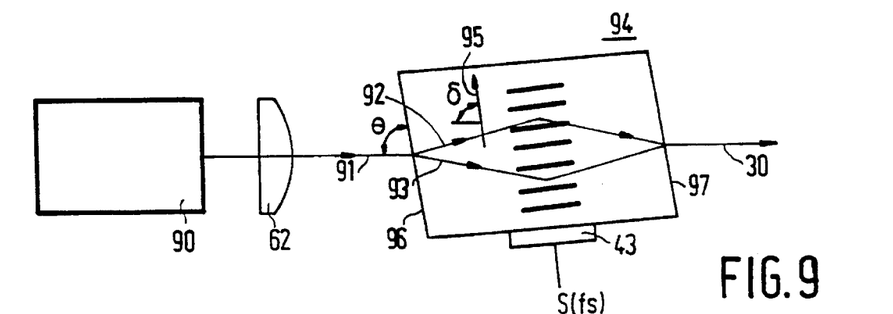
FIG. 9 shows a variant of this embodiment with an integrated beam splitter, modulator and beam combiner.

The embodiment shown in FIG. 8 can be simplified as shown in FIG. 9. The acousto-optical modulator 94 is now inclined relative to the chief ray of the beam 91 from the wavelength-stabilised laser 90, so that the angle δ of the optic axis 95 relative to this chief ray deviates from 90°. Moreover, the entrance face 96 of the modulator is disposed at an angle θ deviating from 90° relative to the chief ray of the beam 91. In a manner similar to that described in European Patent Specification 0,194,940 this entrance face functions as a beam splitter, so that no separate beam splitter is needed. The exit face 97 of the modulator extends parallel to the entrance face 96 and from this exit face two mutually perpendicularly polarised components emerge which are parallel to one another and together form the exit beam 30. A separate beam combiner is no longer needed. In a manner similar to that described with reference to FIG. 8 the large frequency difference, for example 640 MHz, between the beam components of the stabilised laser 90 is converted to a substantially smaller frequency difference, for example 20 MHz. For the present and other embodiments the selected frequency difference between the exit beam components will generally be an optimum compromise between detector signal processing circuits which are as simple and cheap as possible and a maximal measurement speed in the system in which the radiation-source unit has been incorporated.

In comparison with a wavelength-stabilised laser in accordance with European Patent Specification 0,194,940 the radiation-source unit shown in FIG. 9 has the advantage that the electro-acoustic transducer 43 is not arranged on the exit face 97 so that this entire surface is available for the emergent beam 30. Moreover, the unit shown in FIG. 9 uses both polarisation components of the laser beam 91 and the device in accordance with said European Patent Specification 0,194,940 uses only one of these components.

Whereas all the embodiments of the radiation-source unit in accordance with the invention use acousto-optical modulators different types of element can be used for the beam splitter and beam combiner, the beam splitter and beam combiner for a radiation-source unit always being of the same type. These elements may be formed by:

birefringent plates and wedges;

Wollaston prisms of various types, such as those in accordance with Nomarski, Girard or Francon;

Fresnel prisms, Köster prisms and Rochon prisms;

polarisation-sensitive splitting mirrors;

diffraction gratings such as phase gratings.

Figure 10:
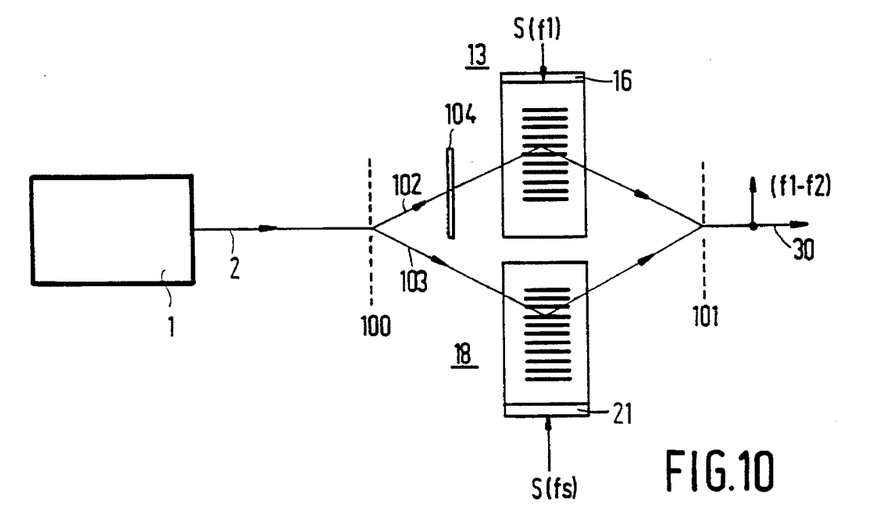
FIG. 10 shows an embodiment of the radiation-source unit having a beam splitter in the form of a grating.

FIG. 10 shows an embodiment of the radiation-source unit employing a diffraction grating 100 as a beam splitter. This grating is constructed in such a manner that the radiation incident on it is mainly diffracted in the +1 order and −1 order. In one of the first order sub-beams, for example the sub-beam 102, a λ/2 plate 104 is disposed, which plate rotates the direction of polarisation of this beam through 90° so that the sub-beams 103 and 104 have mutually perpendicular directions of polarisation. The sub-beams traverse the acousto-optical modulators 13 and 18 in manner similar to that in the device shown in FIG. 1. The sub-beams which emerge from the modulators are incident on a second diffraction grating 101, which is again of such a construction that it mainly diffracts in the first orders, so that the sub-beams are recombined to form a beam 30. The frequency difference of the components of this beam is again determined by the frequency difference between the modulator drive signals $S(f_1)$ and $S(f_2)$. The angle between the sub-beams 102 and 103 is determined by the period of the grating 100. By selecting this period to be sufficiently large the angle between the sub-beams can be made so small that only one acousto-optical modulator is required, as in the embodiment shown in FIG. 2. Again two acousto-optical modulators can be arranged in tandem in a similar way as in FIG. 5.

Figure 11:
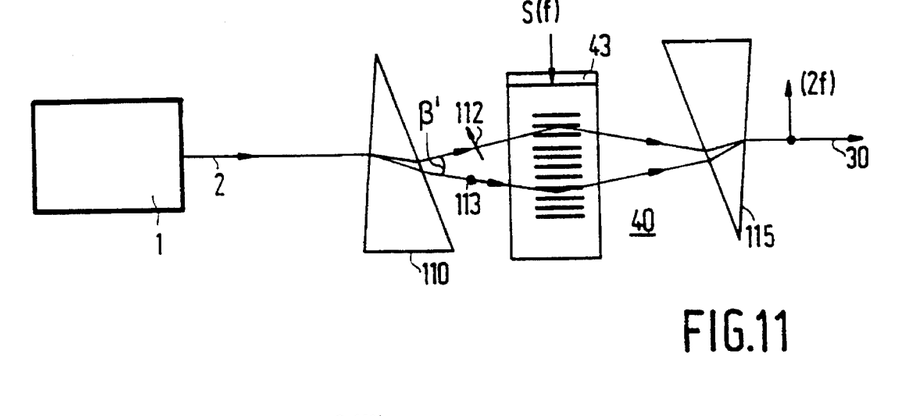
FIG. 11 shows an embodiment of the radiation-source unit in which the beam splitter and the beam combiner are formed by optical wedges.

FIG. 11 shows an embodiment of the radiation-source unit employing a birefringent wedge as a beam splitter. This wedge splits the beam 2 from the source 1 into two sub-beams 112 and 113 having mutually perpendicular directions of polarisation. The splitting angle $\beta^1$ is so small that the sub-beams can be passed through one acousto-optical modulator 40. The sub-beams emerging from the modulator traverse a second birefringent wedge 115 which recombines the sub-beams. In the case of a larger splitting angle $\beta^1$ separate modulators may be arranged in the sub-beams 112, 113. Moreover, it is again possible to arrange two modulators in tandem in a way similar to that shown in FIG. 5.

Figure 12:
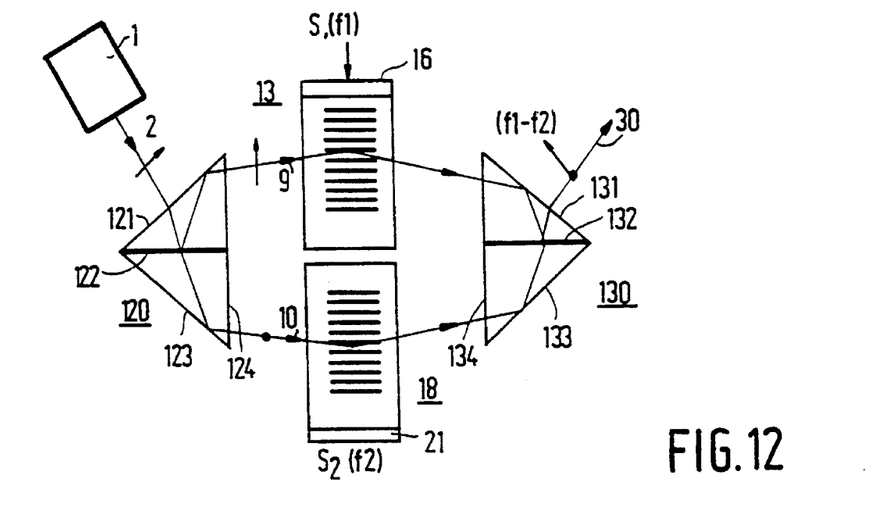
FIG. 12 shows an embodiment of the radiation-source unit in which the beam splitter and the beam combiner are formed by Köster prisms.

FIG. 12 shows an embodiment of the radiation-source unit employing a Köster prism 120 as a beam splitter. The beam 2 which enters the prism by the face 121 is split into two sub-beams 9 and 10 at the interface 122, which is polafisation-sensitive in the present case, which sub-beams have mutually parallel directions of polarisation in the present case. The sub-beams 9 and 10 experience total internal reflection at the prism faces 121 and 123 and subsequently leave the prism by the face 124. After the sub-beams have traversed separate modulators 13 and 18 and have been given a mutual frequency difference $\Delta f = f_1 - f_2$ they enter a second Köster prism via the face 134. In this prism they are subjected to total internal reflection from the faces 131 and 132, after which one of the sub-beams is reflected from the polarisation-sensitive interface 132 and the other sub-beam is transmitted, the sub-beams then being recombined to one emergent beam 30.

If the Köster prism deflects the sub-beams 9 and 10 adequately towards one another only one acousto-optical modulator is required in a similar way as in FIG. 9. It is then also possible to arrange two modulators in tandem as in FIG. 5.

Figure 13:
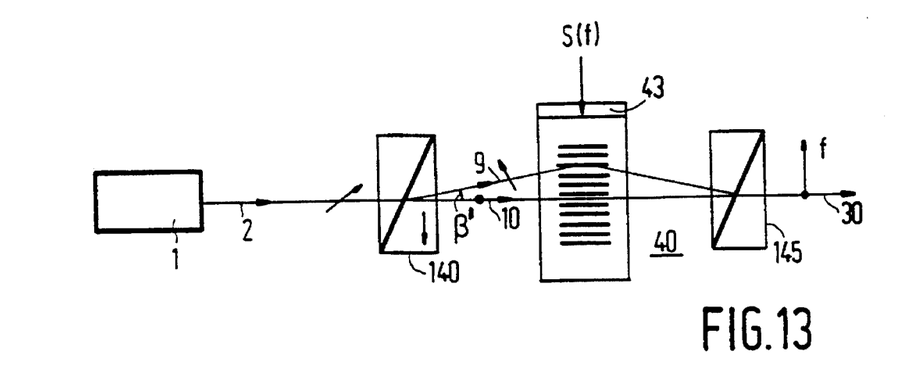
FIG. 13 shows an embodiment of the radiation-source unit in which the beam splitter and the beam combiner are formed by Rochon prisms.

Instead of a Wollaston prism the beam splitter can be a Rochon prism, as is shown in FIG. 13. This prism 140, which comprises two prism elements having mutually perpendicular axes, differs from the Wollaston prism in that only one of the sub-beams, for example the beam 9, is deflected. The sub-beams traverse one common acousto-optical modulator 40, or two sperate modulators in the case of a larger splitting angle β, so that they are given a frequency difference. The beams which emerge from the modulator are recombined by a second Rochon prism 145. If a smaller frequency difference between the emergent beam components is required it is again possible to arrange two acousto-optical modulators in tandem.

In all the embodiments of the radiation-source unit in accordance with the present invention an optical fibre for guiding the beam 30 in the measurement system may be arranged on the face via which the beam 30 emerges, for example the exit face of the beam combiner or the exit face of the acoustic Wollaston prism.

The embodiments shown use discrete optical parts. However, it is alternatively possible to construct the radiation-source unit as a so-called planar integrated optical device, in which the beam splitter, the acousto-optical modulator and the beam combiner are formed in a radiation guide on a substrate, which substrate may also carry a diode laser.

Figure 14:
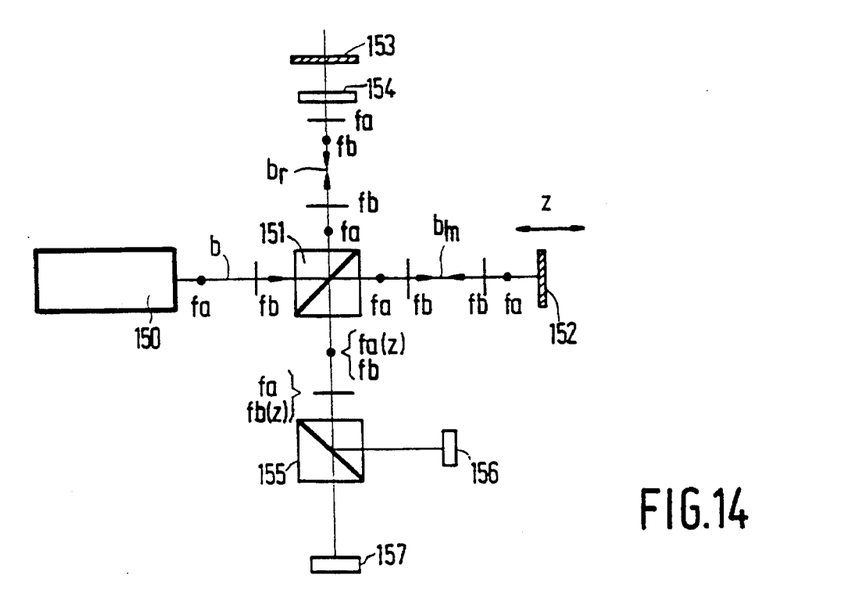
FIG. 14 shows an interferometer comprising a radiation-source unit in accordance with the invention.

As already stated, the radiation-source unit in accordance with the invention can be used very advantageously in an interferometer, for example for measuring a linear displacement of an object. Such an interferometer is shown in FIG. 14. The construction and operation of such an interferometer are described in the article "Displacement measurement with a laser interferometer" in "Philips Technical Review", 30, 1969, No. 6, 7, pp. 160–165. Whereas the known interferometer uses a Zeeman laser as radiation-source unit the new interferometer comprises a radiation-source unit in accordance with the invention, which may be of a construction as described with reference to the preceding Figures. The beam b which emerges from the radiation-source unit 150 has two mutually perpendicularly polarised components with different frequencies, $f_a$ and $f_b$, and is split into a measurement beam $b_m$ and a reference beam $b_r$ by a neutral beam splitter 151. The measurement beam $b_m$ is reflected to the beam splitter 151 by a reflector 152 which is connected to an object and which is movable in the Z direction. The reference beam $b_r$ is reflected to the beam splitter 151 by a reference reflector 153, the reference beam passing twice through a λ/4 plate 154 interposed between the beam splitter and the reference reflector, so that the direction of polarisation of the beam $b_r$ is rotated through 90°. The beam splitter 151 recombines the measurement beam and the reference beam to one beam having two pairs of components. The first pair, referenced $f_{a(z)}$ and $f_b$ in FIG. 14, has a direction of polarisation perpendicular to the plane of drawing and the second pair, referenced $f_a$ and $f_{b(z)}$, has a direction of polarisation parallel to the plane of drawing. The first pair and the second pair of components are separated from one another by a polarisation-sensitive beam splitter 155 and subsequently impinge on a first measurement detector 156 and a second measurement detector 157, respectively. As described in the last-mentioned article with reference to FIG. 5 of this article, the first detector 156 supplies a signal $S_{156}$ proportional to:

$$\sin\left[2\pi(f_a - f_b)t + \frac{4\pi}{\lambda}\Delta Z\right]$$

and the second detector 157 supplies a signal $S_{157}$ proportional to:

$$\sin\left[2\pi(f_a - f_b)t - \frac{4\pi}{\lambda}\Delta Z\right],$$

where $\Delta Z$ is the displacement of the measurement reflector. Determining $\Delta Z$ is possible by comparing the phases of the signals $S_{156}$ and $S_{157}$.

Alternatively, the neutral beam splitter 151 may be replaced by a polarisation-sensitive beam splitter, in which case only one measurement detector is used, as described in the last-mentioned article with reference to FIG. 4 of this article. The signal supplied by this detector is then compared with a reference signal which is obtained, for example, by means of a neutral beam splitter between the radiation-source unit 150 and the polarisation-sensitive beam splitter and a detector disposed in the path of the component of the radiation source beam obtained by means of the neutral beam splitter. For further details of the construction and operation of the interferometer reference is made to the last-mentioned article.

The radiation-source unit in accordance with the invention can be used in two ways in an apparatus for repetitive imaging of a mask pattern on a substrate. Such an apparatus, which is described in U.S. Pat. No. 5,100,237, is shown diagrammatically in FIG. 15. The main components of this apparatus are a projection column, in which a mask pattern C to be imaged is arranged and a movable substrate table WT with which the substrate can be positioned with respect to the mask pattern C.

Figure 15A:
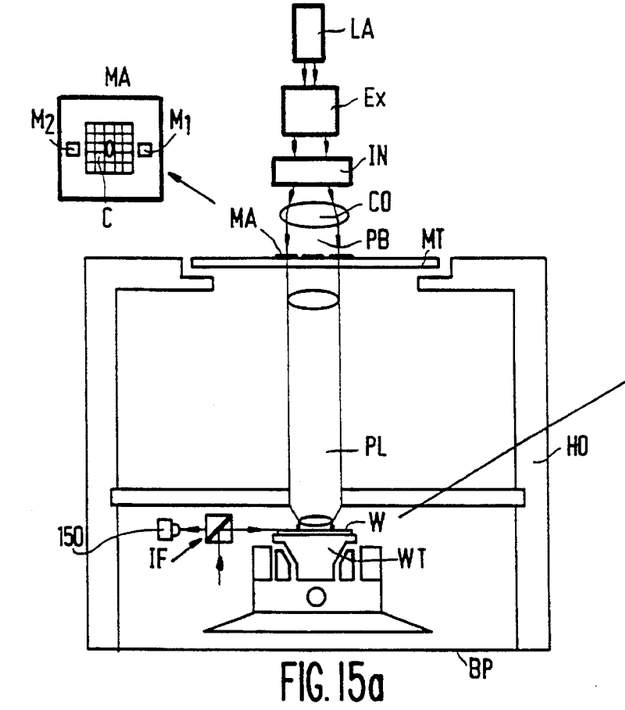
FIG. 15 shows a photolithographic projection apparatus using the radiation-source unit in accordance with the invention.
Figure 15B:
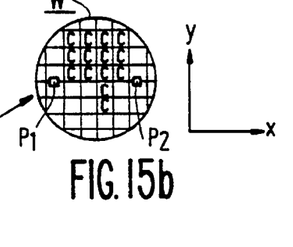

The projection column incorporates an illumination system which comprises, for example, a laser LA, a beam widener $E_x$, an element IN, also referred to as an integrator, which provides a homogeneous radiation distribution within the projection beam PB, and a condenser lens CO. The projection beam PB illuminates the mask pattern C present in the mask MA, which mask is arranged on a mask table MT.

The beam PB passing through the mask pattern C traverses a projection lens system PL arranged in the projection column and shown only diagrammatically, which system forms an image of the pattern C on the substrate W. The projection lens system has, for example a magnification M=⅕, a numerical aperture N.A.=0.48 and a diffraction-limited image field with a diameter of 22 mm.

The substrate W is arranged on a substrate table WT which is, for example, air supported. The projection lens system PL and the substrate table WT are arranged in a housing HO which is closed at its lower side by a base plate BP of, for example granite and at its upper side by the mask table MT.

To determine the position and the displacements of the substrate relative to the projection lens the apparatus comprises an interferometer system, represented diagrammatically as IF in FIG. 13. This interferometer system comprises a radiation-source unit 150 in accordance with the invention and may be constructed as described with reference to FIG. 14.

The apparatus further comprises an alignment system for aligning the substrate relative to the mask pattern by means of alignment marks on the substrate and in the mask MA.

As is shown in FIG. 15, the mask MA has two alignment marks $M_1$ and $M_2$. These marks preferably consist of diffraction gratings but they may be formed alternatively by other marks such as squares or strips which are optically distinct from their surroundings. The alignment marks are preferably two-dimensional, i.e. they extend in two mutually perpendicular directions, the X and Y directions in FIG. 1. The substrate W, for example, a semiconductor substrate on which the pattern C must be projected side by side for a number of times, comprises a plurality of alignment marks, preferably also two-dimensional diffraction gratings, two of which, $P_1$ and $P_2$ are shown in FIG. 15. The marks $P_1$ and $P_2$ are located outside the regions on the substrate W where the pattern C is to be imaged. Preferably, the grating marks $P_1$ and $P_2$ are in the form of phase gratings and the grating marks $M_1$ and $M_2$ are in the form of amplitude gratings.

Figure 16:
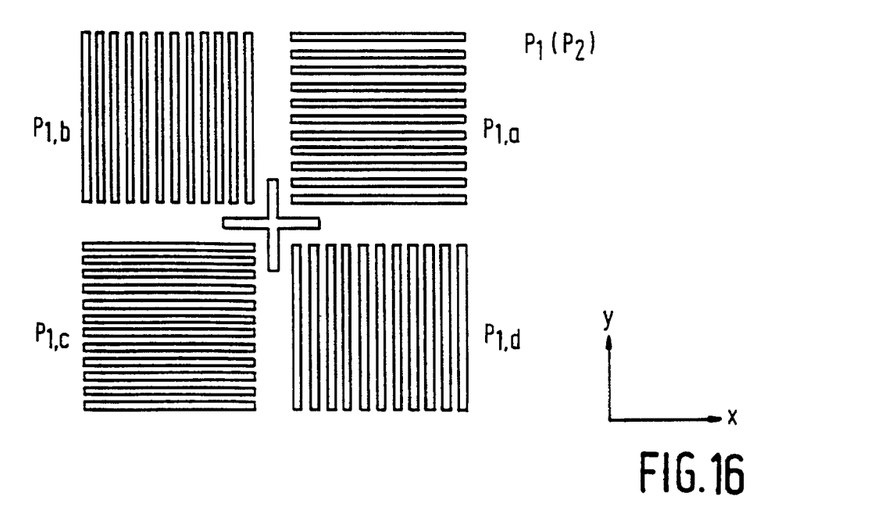
FIG. 16 shows an alignment mark of the alignment system of said apparatus.

FIG. 16 shows an embodiment of one of the two identical substrate phase gratings to an enlarged scale. Such a grating may comprise four sub-gratings $P_{1,a}$, $P_{1,b}$, $P_{1,c}$ and $P_{1,d}$, two of which, $P_{1,b}$ and $P_{1,d}$, are used for alignment in the X direction and the two other sub-gratings, $P_{1,b}$ and $P_{1,c}$ are used for alignment in the Y direction. The two sub-gratings $P_{1,b}$ and $P_{1,c}$ have a grating period of, for example, 16 μm and the sub-gratings $P_{1,a}$ and $P_{1,d}$ a have a grating period of, for example, 17.6 μm. Each sub-grating may have a dimension of, for example, 200×200 μm. An alignment accuracy which in principle is less than 0.1 μm can be achieved with these gratings and a suitable optical system. The different grating periods have been chosen so as to increase the capture range of the alignment device.

Figures 17A, 17B, 17C:
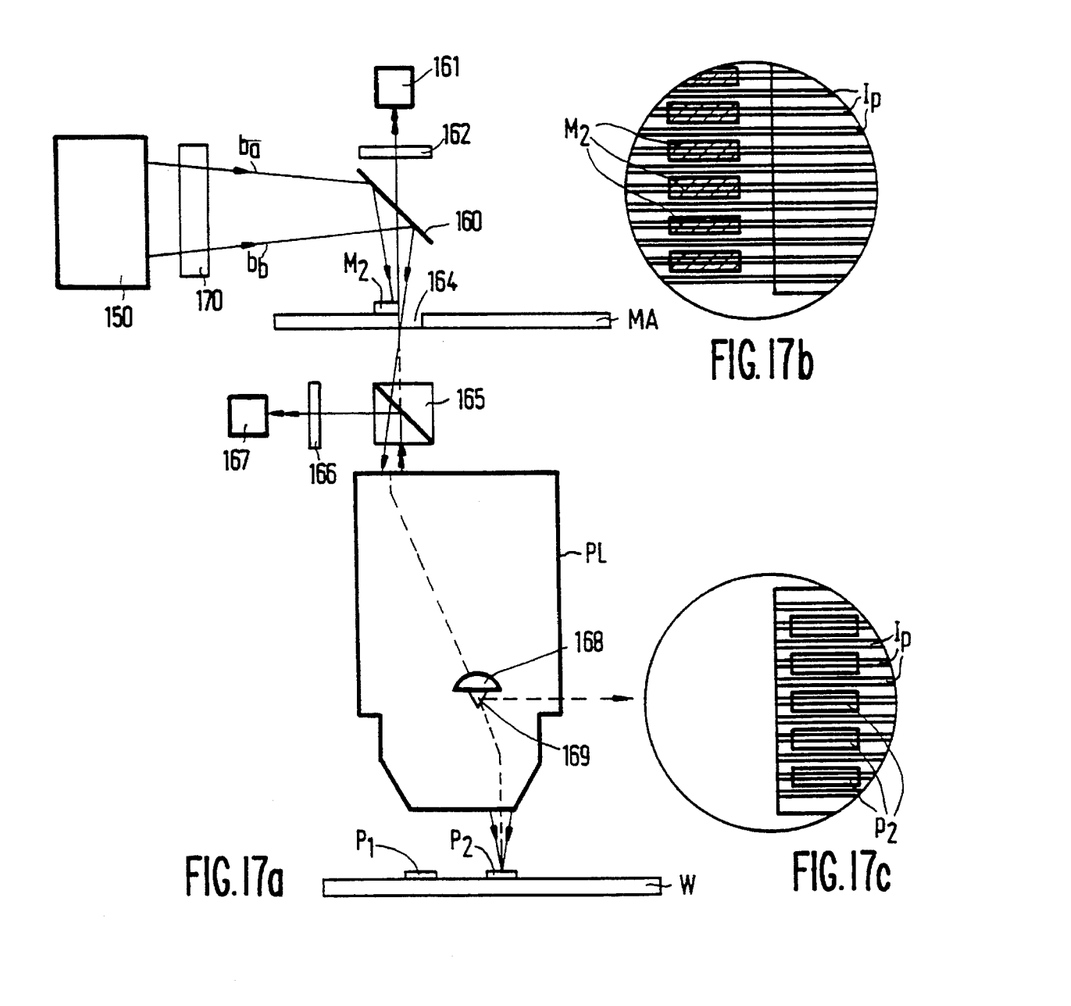
FIG. 17 shows an example of the alignment system.

FIG. 17 shows diagrammatically a possibility of indirectly aligning a mask alignment mark and a substrate alignment mark with respect to each other, in which method as a third mark an artificial alignment mark is used. This third mark consists of an interference pattern IP formed by two beams $b_a$ and $b_b$ which interfere with each other in the plane of the mask alignment mark $M_2$. The upper inset in FIG. 17 shows the interference pattern IP which is superposed on the mask alignment mark $M_2$ implemented as a reflective grating. This grating deflects the incident radiation in different diffraction orders towards a first detector 161. A filter 162 transmitting only the first-order sub-beams is arranged before this detector. The output signal of the detector 161 represents the position of the mark $M_2$ with respect to the interference pattern IP.

Next to the mark $M_2$ the mask MA has a window 164 passing radiation from the interfering beams $b_a$ and $b_b$ to the projection lens system PL. This system re-images the interference pattern IP on the substrate alignment mark $P_2$, as is shown in the lower inset in FIG. 17. The mark $P_2$, implemented as a reflective grating, diffracts the incident radiation in a plurality of reflected diffraction orders. The reflected radiation reaches a second detector 167 via the projection lens system and a semitransparent prism 165. The projection lens system PL includes a correction element 168, which ensures that the interference pattern is sharply imaged on the mark $P_2$ despite the fact that the projection lens system has been properly corrected only for the wavelength of the projection beam. A filter 166 for selecting the first-order sub-beams may be arranged between the detector 167 and the prism 165.

It is alternatively possible to arrange a reflector 169 underneath the correction element 168, which reflector reflects the first-order sub-beams to the right so that these beams can leave the projection lens via a window in the wall of the projection lens holder, as is denoted by the broken-line ray.

If the beams $b_a$ and $b_b$ are formed by the components of a beam from a radiation-source unit 150 in accordance with the invention and an analyzer 170 is arranged in the path of these components in order to ensure that the transmitted sub-beams have the same direction of polarisation the interference pattern which is then formed will vary with time, thereby simulating that the interference pattern moves across the mask alignment mark and across the substrate alignment mark, which results in periodically varying alignment signals. The difference between the phases of the output signals of the detectors 161 and 167 is then representative of the extent to which the marks $M_2$ and $P_2$ are mutually aligned.

Apart from the above-mentioned uses in interferometers for the measurement of linear displacements and rotations and in alignment systems for a lithographic projection apparatus the radiation-source unit in accordance with the invention has numerous other applications. This unit can be used, for example, in:

shearing interferometers for the measurement of lens aberrations;

fibre-optic interferometric sensors for the measurement of temperature, pressure, flow, rotations, magnetic fields and stresses in materials or objects;

atomic scanning force microscopes for measuring tip displacements;

profilometers;

apparatuses for measuring birefringence or refractive indices of materials, or polarisation rotation in materials.

We claim:

1. A radiation-source unit for producing a radiation beam having two components which are polarised perpendicularly to one another and which have different frequencies thereof and further having a desired optical frequency difference, said unit comprising:

a coherent radiation source;

a beam splitter;

an acousto-optical modulation system for generating a desired frequency difference between two sub-beams formed by said beam splitter, said acousto-optical modulation system receiving a drive signal having a drive signal frequency, wherein tile drive signal frequency dictates a desired optical frequency difference between the two sub-beams; and a beam combiner for recombining the two sub-beams emerging from said modulation system to one beam, wherein said beam splitter is a polarisation-sensitive beam splitter which forms two linearly polarised sub-beams having mutually perpendicular directions of polarisation, further wherein said beam splitter and said beam combiner are of a similar type and operate in transmission, still further wherein a connecting line between a centre of said beam splitter and said beam combiner extends through a centre of said modulation system, and wherein said beam splitter, said modulation system, and said beam combiner form a symmetrical unit about the centre of said modulation system.

2. The radiation-source unit as claimed in claim 1, wherein said acousto-optical modulation system comprises a separate acousto-optical modulator for each sub-beam in which a first acousto-optical modulator is disposed in a path of a first sub-beam and a second acousto-optical modulator is disposed in a path of a second sub-beam, and wherein the drive signal comprises a first drive signal for driving the first acousto-optical modulator and a second drive signal for driving the second acousto-optical modulator, the first drive signal having a frequency (f1) different from a frequency (f2) of the second drive signal, said modulation system thereby imparting a frequency difference of (f1–f2) between the two sub-beams.

3. The radiation-source unit as claimed in claim 1, wherein said modulation system comprises a first acousto-optical modulator, and wherein each of the two sub-beams are characterized by a chief ray, which when described together comprise chief rays, wherein the chief rays of the sub-beams traverse the first acousto-optical modulator along separate paths.

4. The radiation-source unit as claimed in claim 3, wherein said modulation system further comprises a second acousto-optical modulator disposed between the first acousto-optical modulator and said beam combiner, and wherein the drive signal comprises a first drive Signal for driving the first acousto-optical modulator and a second drive signal for driving the second acousto-optical modulator, the first drive signal having a frequency ($f_{s1}$) different from a frequency ($f_{s2}$) of the second drive signal, said modulation system thereby imparting a frequency difference of $2(f_{s1}-f_{s2})$ between the two sub-beams.

5. The radiation-source unit as claimed in claim 1, wherein said radiation source is a Zeeman laser.

6. The radiation-source unit as claimed in claim 1, wherein said radiation source is a wavelength-stabilised laser which emits two linearly polarised beams having mutually perpendicular directions of polarisation and having different frequencies.

7. The radiation-source unit as claimed in claim 1, wherein said polarisation-sensitive beam splitter is formed by a diffraction grating and a $\lambda/2$ plate arranged in a path of one of the sub-beams, $\lambda$ being the wavelength of radiation provided by said radiation source, and wherein said beam combiner is formed by a diffraction grating.

8. The radiation-source unit as claimed in claim 1, wherein said beam splitter and said beam combiner are each formed by a wedge of a birefringent material.

9. The radiation-source unit as claimed in claim 1, wherein said beam splitter and said beam combiner are each formed by a Rochon prism.

10. The radiation-source unit as claimed in claim 1, wherein said beam splitter and said beam combiner are each formed by a Köster prism.

11. The radiation-source unit as claimed in claim 1, wherein said beam splitter and said beam combiner are Wollaston prisms.

12. The radiation-source unit as claimed in claim 3, wherein said beam splitter, the first acousto-optical modulator and said beam combiner are integrated in a first symmetrical three-element Wollaston prism whose outer elements form said beam splitter and said beam combiner, respectively, and whose inner element is provided with an electro-acoustic transducer and thus forms the acousto-optical modulator.

13. The radiation-source unit as claimed in claim 12, further comprising a second symmetrical three-element Wollaston prism similar to the first symmetrical three-element Wollaston prism, wherein the first symmetrical three-element Wollaston prism is followed by the second symmetrical thru-element Wollaston prison and wherein a first drive signal drives the acousto-optical modulator of the first symmetrical three-element Wollaston prism and a second drive signal drives an acousto-optical modulator of the second symmetrical three-element Wollaston prism, further wherein a frequency $(f_{s1})$ of the first drive signal for the acousto-optical modulator of the first three-element Wollaston prison differs from a frequency $(f_{s2})$ of the second drive signal for the acousto-optical modulator of the second three-element Wollaston prism, whereby the two components of a radiation beam produced by said radiation-source unit have a frequency difference of $2(f_{s1}-f_{s2})$.

14. The radiation-source unit as claimed in claim 12, wherein the inner element of the Wollaston prism is provided with a second electro-acoustic transducer and further wherein, in operation, drive signals of different frequencies are applied to the two transducers.

15. The radiation-source unit as claimed in claim 3, wherein said radiation source is a wavelength-stabilised laser which emits a laser beam of two linearly polarised beam components having mutually perpendicular directions of polarisation and having different frequencies, further wherein said beam splitter and said beam combiner are formed, respectively, by an entrance face and an exit face of the first acousto-optical modulator, which faces extend parallel to one another and make an angle deviating from 90° with a chief ray of the laser beatn and wherein an optic axis of the modulator makes an angle deviating from 90° with the chief ray of the laser beam.

16. An interferometer comprising a radiation-source unit, a beam splitter for splitting the beam emitted by said radiation-source unit into a measurement beam and a reference beam, a measurement branch traversed by the measurement beam, a reference branch traversed by the reference beam, and a radiation-sensitive detector in the path of a beam formed by recombining the measurement beam and the reference beam which have traversed their respective branches, wherein said radiation-source unit is a unit as claimed in claim 1.

17. A device for detecting a position of a first object relative to a second object, which objects have been provided with marks, said device comprising: an illumination system for producing two beams whose components with the same direction of polarisation together form an interference pattern on both the mark of the first object and the mark of the second object, a first and a second radiation-sensitive detector for converting radiation received from the mark of the first object and the mark of the second object, respectively, into a first electric signal and a second electric signal, respectively, a phase difference between the two signals being indicative of the position of the two objects relative to one another, wherein said illumination system comprises a radiation-source unit as claimed in claim 1.

18. An apparatus for projecting a mask onto a substrate, said apparatus comprising, in succession: an illumination system producing an actinic radiation beam; a mask holder; a projection lens system; and a substrate holder; and further comprising an alignment system for aligning the mask relative to the substrate, wherein said alignment system comprises a device as claimed in claim 17, the first object being the mask and the second object being the substrate.

19. An apparatus for projecting a mask onto a substrate, said apparatus comprising, in succession: an illuminination system producing an actinic radiation beam; a mask holder; a projection lens system; and a substrate holder; and further comprising an interferometer system for detecting the position and displacements of said substrate holder, wherein said interferometer system includes at least one radiation-source unit as claimed in claim 1.

20. An apparatus as claimed in claim 18, comprising an interferometer system for detecting the position and displacements of said substrate holder, wherein said interferometer system includes at least one radiation-source unit for producing a radiation beam having two components which are polarised perpendicularly to one another and which have different frequencies thereof and further having a desired optical frequency difference, said at least one radiation-source unit comprises:

a coherent radiation source;

a beam splitter;

an acousto-optical modulation system for generating a desired frequency difference between two sub-beams formed by said beam splitter, said acousto-optical modulation system receiving a drive signal having a drive signal frequency, wherein the drive signal frequency dictates a desired optical frequency difference between the two sub-beams; and a beam combiner for recombining the two sub-beams emerging from said modulation system to one beam, wherein said beam splitter is a polarisation-sensitive beam splitter which forms two linearly polarised sub-beams having mutally perpendicular directions of polarisation, further wherein said beam splitter and said beam combiner are of a similar type and operate in transmission still further wherein a connecting line between a centre of said beam splitter and said beam combiner extends through a centre of said modulation system, and wherein said beam splitter, said modulation system, and said beam combiner form a symmetrical unit about the centre of said modulation system.

* * * * *